US007358497B1

(12) United States Patent
Boreman et al.

(10) Patent No.: US 7,358,497 B1
(45) Date of Patent: Apr. 15, 2008

(54) INFRARED/MILLIMETER-WAVE FOCAL PLANE ARRAY

(75) Inventors: Glenn D. Boreman, Geneva, FL (US); Mohamed AbdelRahman, Alexandria (EG)

(73) Assignee: University of Central Florida Research Foundation, Inc., Orlando, FL (US)

( * ) Notice: Subject to any disclaimer, the term of this patent is extended or adjusted under 35 U.S.C. 154(b) by 119 days.

(21) Appl. No.: 11/183,442

(22) Filed: Jul. 18, 2005

Related U.S. Application Data

(60) Provisional application No. 60/669,515, filed on Apr. 8, 2005.

(51) Int. Cl.
*G01J 5/00* (2006.01)
(52) U.S. Cl. .................................... 250/332
(58) Field of Classification Search ................ 250/332
See application file for complete search history.

(56) References Cited

U.S. PATENT DOCUMENTS 4,654,622 A * 3/1987 Foss et al. .................... 338/14
5,404,146 A * 4/1995 Rutledge ..................... 343/720
5,436,453 A * 7/1995 Chang et al. .............. 250/338.1
6,329,649 B1 * 12/2001 Jack et al. .................... 250/250
6,459,084 B1 * 10/2002 Boreman et al. ........... 250/349

OTHER PUBLICATIONS

M.R. Abdel-Rahman, et al. "Antenna-coupled metal-oxide-metal diodes for dual-band detaction at 92.5 GHz and 28 THz" Jan. 22, 2004, Electronics Letters, vol. 40, No. 2.

* cited by examiner

*Primary Examiner*—Constantine Hannaher
(74) *Attorney, Agent, or Firm*—Brian S. Steinberger; Phyllis K. Wood; Law Offices of Brian S. Steinberger, P.A.

(57) ABSTRACT

An antenna-coupled dual-band focal plane array for detecting radiation in the infrared and millimeter-wave bands. The dual-band focal plane array includes a millimeter antenna-coupled pixel incorporating an array of infrared antenna-coupled pixels in a two-dimensional focal plane array format for detecting infrared and millimeter-wave radiation. The configuration allows for a single aperture system capable of operating in both the infrared and millimeter bands. The system further includes electronics for sampling the millimeter antenna-coupled pixel and the array of infrared antenna-coupled pixels for course spatial sampling of the millimeter pixel and fine spatial sampling of the infrared pixels. Application areas can include collision avoidance, bad-weather driving, and maritime navigational aids.

13 Claims, 5 Drawing Sheets

INFRARED/MILLIMETER-WAVE FOCAL PLANE ARRAY

CROSS REFERENCE TO RELATED APPLICATIONS

This application claims the benefit of priority to U.S. Provisional application Ser. No. 60/669,515 filed on Apr. 8, 2005.

STATEMENT REGARDING FEDERALLY SPONSORED RESEARCH OR DEVELOPMENT

The subject matter of this application was funded in part by DARPA under ARO contract number DAAD19-02-1-0232.

THE NAMES OF PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention relates to a millimeter-wave focal plane array and, in particular, to apparatus, systems and methods for a dual-band focal plane array with simultaneous response at infrared and millimeter-wave frequency bands.

2. Description of Related Art Including Information Disclosed Under 37 CFR 1.97 and 1.98

Conventional millimeter-wave focal plane array pixel spacing is limited by the wavelength of the millimeter wave (mmW), typically having a wavelength of approximately 3 mm which corresponds to a frequency of approximately 100 GHz. As shown in FIG. 1, the system 10 includes an optical lens 12 that focuses millimeter-wave radiation within the field of view into an array of pixel elements 20 positioned in the focal plane 15 of the lens 12. Millimeter radiation from a scene within the field of view is directed onto the focal plane array 20 by optical lens 12 or other millimeter wave device. The pixel spacing on the focal plane array is approximately one wavelength between sensors because the spatial resolution spot produced by the optical lens 12 onto the focal plane array 20 is proportional to the wavelength. Therefore, a focal plane array tuned for long-wavelength radiation would have pixels spaced by a larger distance than would a focal plane array tuned for a shorter wavelength radiation.

Antenna-coupled metal-oxide-metal (MOM) diodes was used in the past for detection and mixing in the infrared (IR) and millimeter-wave (mmW) portion of the spectrum as described in Boreman et al, "Antenna-coupled metal-oxide-metal diodes for dual band detection at 92.5 GHz and 28 THz", Electronics Letters, Vol. 40, No. 2, Jan. 22, 2004. The ratio between the two required frequencies of operation is approximately 300:1. One example of a design using the antenna-coupled MOM diode includes a frequency dependent antenna structure with a small enough feed to allow for operation at the higher frequency limit with the diode located at the antenna feed. In another example, the diode is integrated with two resonant antenna structures at the two required frequencies of operation.

The MOM diode is located at the center of the slot antenna and is connected to an infrared antenna to achieve infrared and millimeter wave responses. The responses are improved by matching the impedance of the diode and the antennas. The infrared response can be further improved by decreasing the junction, which decreases the junction capacitance and therefore increases the cutoff frequency of the diode.

Therefore, a need exists for a dual-band focal plane array with two different spatial resolutions, one for long-wavelength radiation, and one for short-wavelength radiation.

BRIEF SUMMARY OF THE INVENTION

A primary objective of the invention is to provide a new apparatus, system and method to provide a dual-band focal plane array.

A secondary objective of the invention is to provide a new apparatus, system and method that is capable of operating simultaneously in the infrared and millimeter-wave bands.

A third objective of the invention is to provide a new apparatus, system and method with simultaneous response in the infrared and millimeter-wave bands with proper sampling between sensors for both bands.

A fourth objective of the invention is to provide a new apparatus, system and method that integrate an array of infrared antennas into the construction of a millimeter-wave antenna.

A fifth objective of the invention is to provide a apparatus, system and method that allows fine spatial sampling of infrared pixels and course spatial sampling of millimeter pixels.

A sixth object of the present invention is to provide an apparatus, system and method for use as a driving aid and as a bad weather maritime aid for collision avoidance.

The present invention provides a dual-band focal plane array for detecting infrared and millimeter-wave radiation. The dual-band focal plane array includes at least one millimeter-wave pixel element and an array of infrared pixel elements incorporated into the construction of the at least one millimeter-wave pixel element in a two-dimensional focal plane array format for detecting the infrared and the millimeter-wave radiation.

Each one of the millimeter-wave pixel element includes a millimeter-wave slot antenna and an array of infrared slot antennas incorporated into said millimeter-wave pixel element. In an embodiment, the array of infrared-slot antennas is incorporated into a ground-plane structure of the millimeter-wave-slot antenna. In an embodiment, each millimeter-wave pixel elements include an 8-by-8 array of infrared pixel elements, while in an alternative embodiment, the array of infrared pixel elements is a 32-by-32 array.

In another embodiment, a dual-band single aperture system for operating in an infrared and millimeter-wave band is provided. The system includes a dual-band focal plane array having a millimeter antenna-coupled pixel and plural infrared-antenna-coupled pixels incorporated into the millimeter antenna-coupled pixel for detection of the infrared and the millimeter-wave radiation, a sampling device for sampling the millimeter antenna-coupled pixel and the plural infrared antenna-coupled pixels at intervals corresponding to the infrared and the millimeter-wave bands; and an output device for collecting the samples and converting the samples into electrical signals to be displayed on a display unit.

In another embodiment, the present invention provides a method for detecting dual bands in a single aperture system. The method includes detecting millimeter-wave radiation at a millimeter antenna-coupled pixel, detecting an infrared-wave radiation at an array of infrared antenna-coupled pixels incorporated into the millimeter antenna-coupled pixel. A detecting device samples the millimeter antenna-coupled pixel and the array of infrared antenna-coupled pixels at intervals corresponding to the dual bands for course spatial sampling of the millimeter pixel element and fine spatial sampling of the infrared pixel elements. The system further includes an output device for converting the collected samples to electrical signal for display on a suitable display device.

Further objects and advantages of this invention will be apparent from the following detailed description of preferred embodiments which are illustrated schematically in the accompanying drawings.

BRIEF DESCRIPTION OF SEVERAL VIEWS OF THE DRAWING(S)

FIG. 2a shows an example of a prior art millimeter-wave focal plane array.

FIG. 2b shows a single millimeter antenna-coupled pixel of FIG. 2a.

FIG. 2c is an exploded view of a millimeter antenna-coupled pixel of FIG. 2a having microbolometer element.

DETAILED DESCRIPTION OF THE INVENTION

Figure 1:
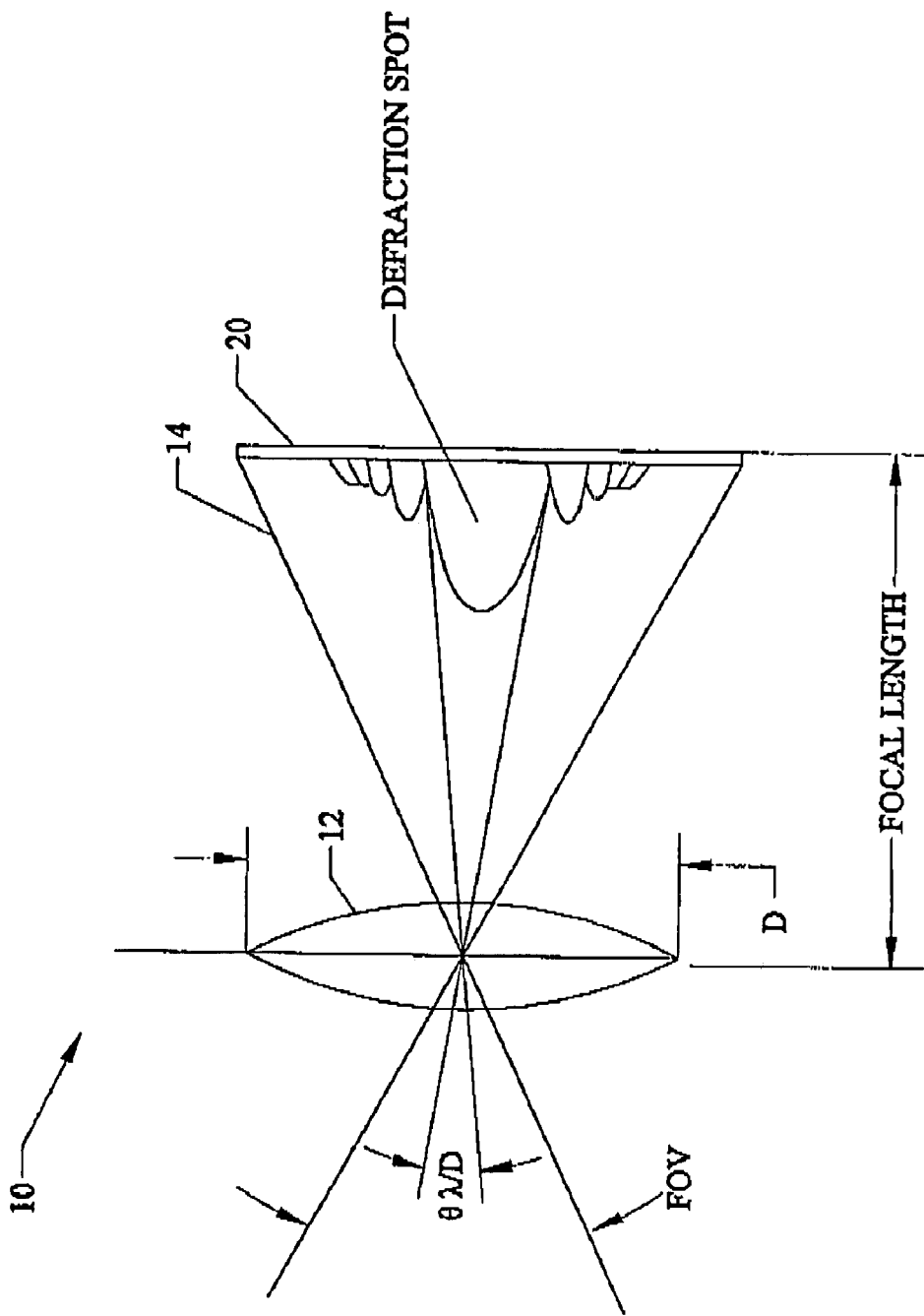
FIG. 1 is a diagram of the pixel spacing on a prior art focal plane array.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components.

| | | |
|---|---|---|
| 10 | optical system | |
| 12 | optical lens | |
| 14 | focal plane | |
| 20 | focal plane array | |
| 100 | millimeter-wave focal plane array | |
| 110 | millimeter pixel element | |
| 120 | microbolometer antenna | |
| 200 | infrared pixel element | |
| 500 | dual-band single aperture system | |
| 505 | dual-band focal plane array | |
| 510 | millimeter pixel element | |
| 520 | infrared pixel element | |
| 530 | detector interface | |
| 540 | output device | |

Figure 2:
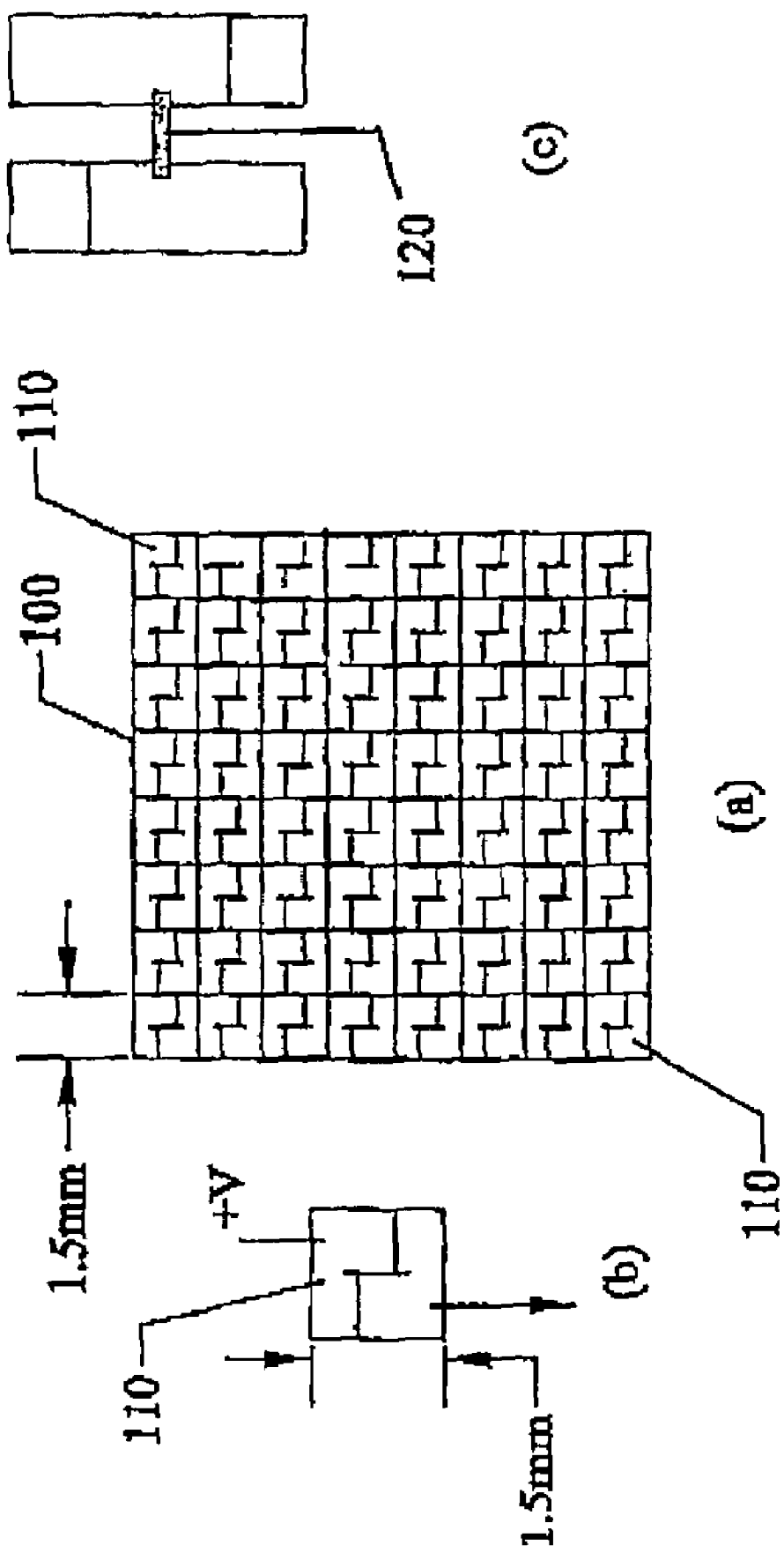

The apparatus, system and method of the present invention provides a dual-band focal plane array that includes an array of infrared antennas incorporated into the construction of a millimeter pixel element. FIG. 2a is a schematic diagram of a conventional one-dimensional millimeter-wave focal plane array 100 including plural millimeter pixel elements 110 that define the focal plane array 100. The dimension of each millimeter pixel element 110 is approximately 1.5 millimeter. FIG. 2b shows a single millimeter pixel element 110 from the millimeter-wave focal plane array 100. Each millimeter pixel element 110 is electrically connected to a substrate (not shown) and each millimeter pixel element 110 includes an antenna that receives the millimeter-wave radiation is coupled with associated electronics to sample the millimeter pixel element and generate a corresponding electrical signal to be displayed on a suitable display unit.

As shown in FIG. 2c, each pixel cell includes a microbolometer element, or microbolometer antenna 120. Referring back to FIG. 2a, the plural millimeter pixel elements 110, each including one microbolometer element 120, are arranged in a two-dimensional focal plane array 100. An array of sampling devices, such as diode detectors, sample the millimeter-wave antenna-coupled pixels and infrared antenna-coupled pixels at intervals. Collecting the samples from each sampling device is accomplished in a standard fashion, using multiplexer circuitry located underneath the antenna arrays.

Figure 3:
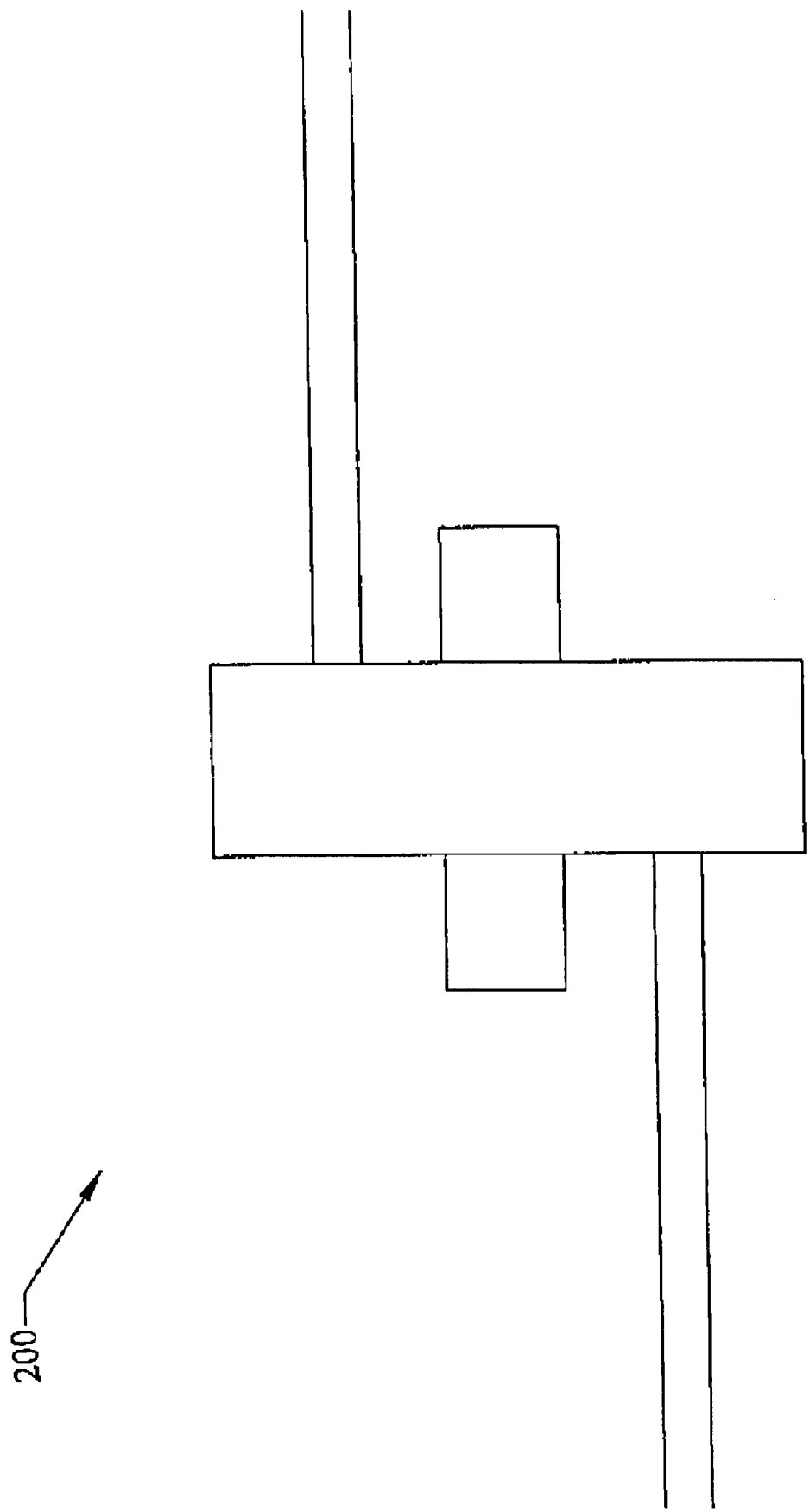
FIG. 3 shows one pixel of an infrared focal plane array.

The apparatus, system and method of the present invention provide an infrared/millimeter-wave focal plane array that incorporates an array of infrared pixel elements in the construction of the millimeter pixel elements. In a preferred embodiment, the millimeter pixel element includes a millimeter-wave slot antenna having an array of infrared-slot antennas incorporated therein as shown in FIG. 3. Each infrared pixel element 200 of the infrared focal plane array is much smaller (approximately 2 micrometers) than the millimeter pixel element 110 (approximately 1.5 millimeters) shown in FIG. 4.

In a preferred embodiment of the dual-band focal plane array, each band has spatial sampling appropriate for the wavelengths of interest and is constructed according to the following description. Plural infrared slot antennas are incorporated into the ground plane of the millimeter-wave slot antenna. The slot antennas tuned to infrared are substantially smaller than the wavelength in the millimeter-wave region, and hence do not substantially affect the operation of the millimeter-wave slot antenna. The two antenna arrays comprising the focal plane array are thus independent yet they occupy the same region, allowing for a shared-aperture system (hereinafter referred to as a dual-plane single aperture system).

Figure 4:
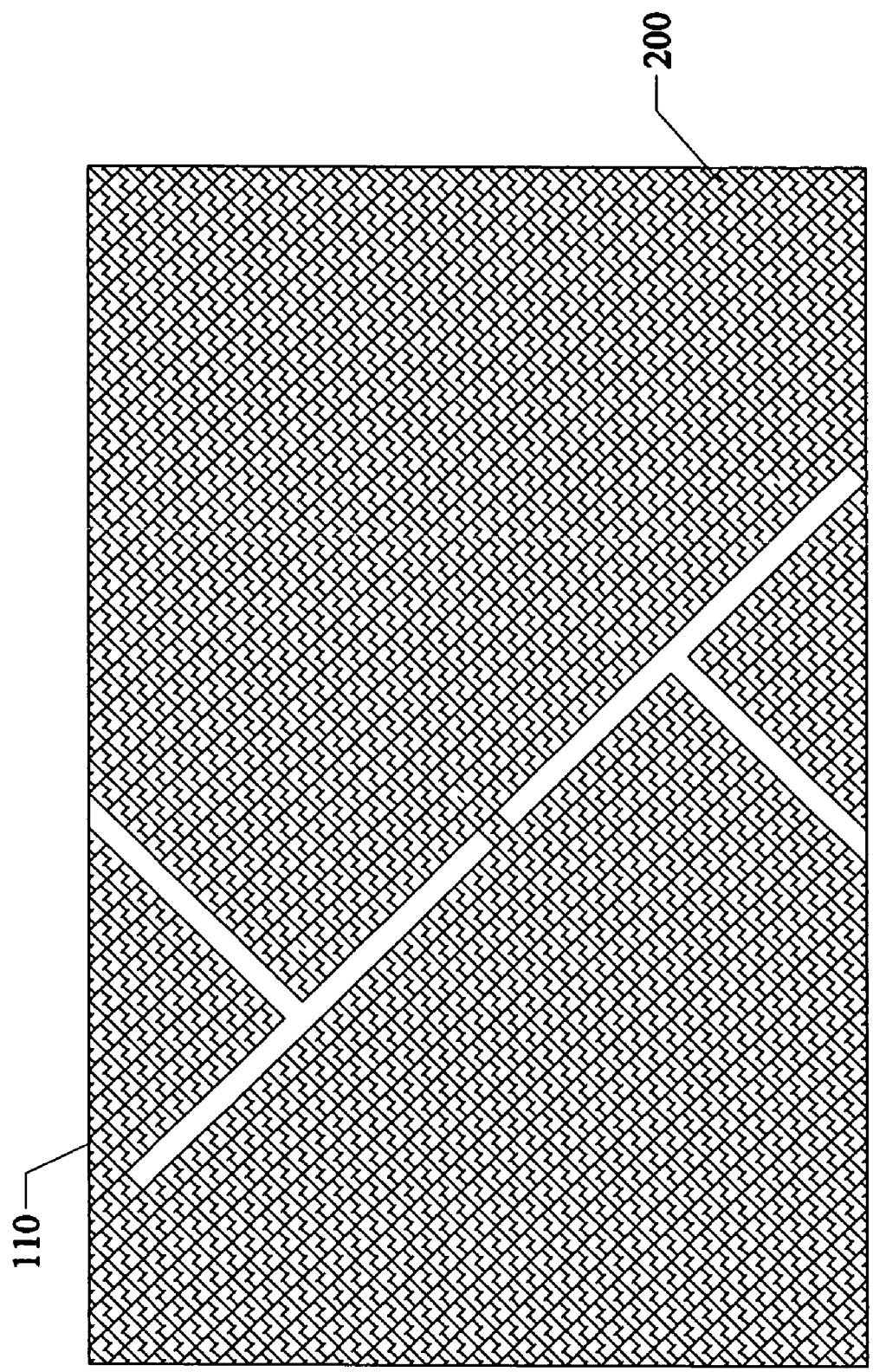
FIG. 4 shows a dual-band focal plane array according to the present invention.

As shown in FIG. 4, according to the present invention, each millimeter pixel element includes plural infrared-wave pixel elements. The millimeter pixel elements are structured to receive radiation in the millimeter band while the infrared pixel elements are structured to substantially simultaneously receive radiation in the infrared band. The dual-band detection system provides sampling intervals between the millimeter and infrared pixel elements corresponding to the two bands. This construction allows for a single aperture system that is capable of operating in the millimeter and infrared bands. In a preferred embodiment, the infrared/millimeter-wave focal plane array of the present invention incorporates the array of infrared-slot antennas into the ground-plane structure of a millimeter-wave-slot antenna.

Figure 5A:
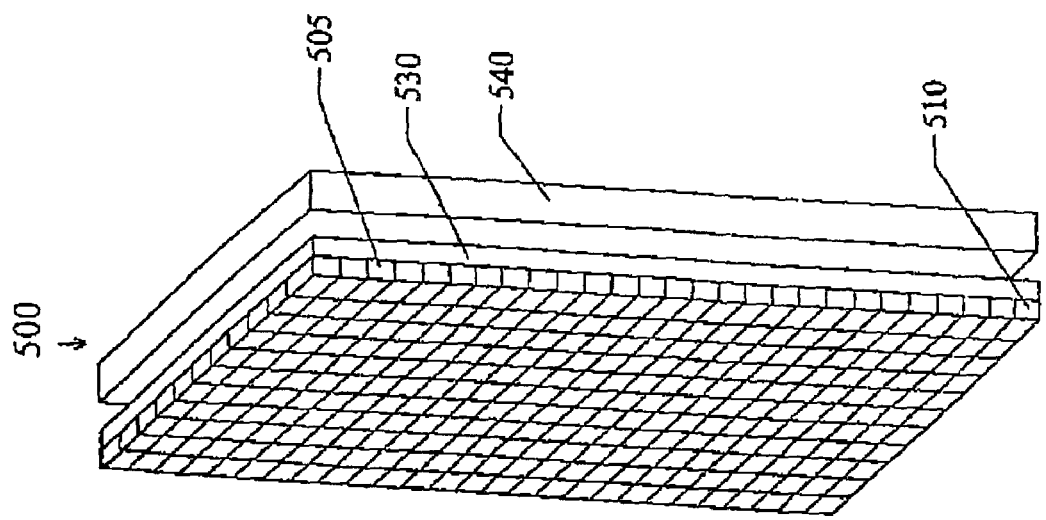
FIG. 5a is a plan view of a dual-band single aperture system according to the present invention.
Figure 5B:
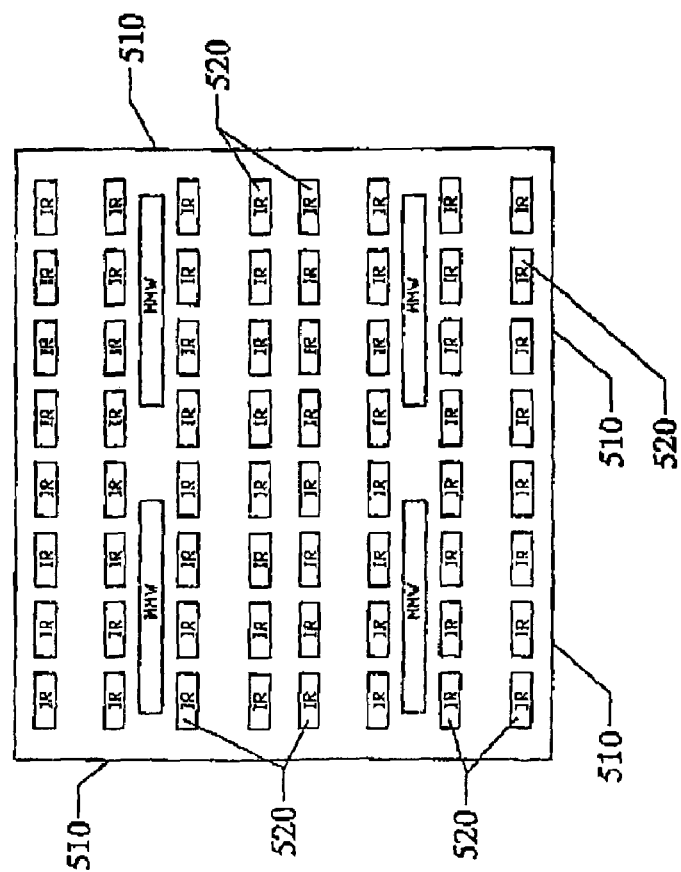
FIG. 5b is an exploded view of a 2×2 array of millimeter pixel elements and 8=8 array of infrared pixel elements incorporated therein according to an embodiment of the present invention.

In a preferred embodiment shown in FIG. 5a, the dual-band single aperture system 500 includes a two-dimensional dual-band focal plane array 505 having a millimeter antenna-coupled pixels 510 and plural infrared antenna-coupled pixels 520 incorporated into the millimeter antenna-coupled pixel 510 for detection of the infrared and the millimeter-wave radiation. In the example shown in FIG. 5b, each millimeter pixel element 510 includes a 4×4 array of infrared pixel elements 520. The 4×4 configuration of the infrared pixel element array within the millimeter pixel element is for illustration purpose only and not of limitation. Those skilled in the art will recognize that alternative array configurations may be substituted. For example, in another embodiment, each millimeter-wave pixel elements include an 8-by-8 array of infrared pixel elements, while in an alternative embodiment, the array of infrared pixel elements is a 32-by-32 array.

The output of the millimeter antenna-coupled pixels 510 and plural infrared antenna-coupled pixels 520 are coupled to a detector or other sampling device 530 for sampling the array of millimeter-wave antenna-coupled pixels and the array of infrared antenna-coupled pixels. The millimeter-wave antenna-coupled pixels and infrared antenna-coupled pixels are sampled at intervals corresponding to the infrared and the millimeter-wave bands. An output device 540 collects the samples and converts the samples into electrical signals to be displayed on a display unit (not shown). Collecting the samples from each sampling device is accomplished in a standard fashion, using multiplexer circuitry located underneath the antenna arrays.

In summary, the present invention provides a new apparatus, system and method that allows for fine spatial sampling of infrared pixel elements and course spatial sampling of millimeter pixel elements. The dual-band focal plane array includes a millimeter antenna-coupled pixel incorporating an array of infrared antenna-coupled pixels in a two-dimensional focal plane array format for detecting infrared and millimeter-wave radiation. The configuration allows for a single aperture system capable of operating in both the infrared and millimeter bands. The system further includes electronics for sampling the millimeter antenna-coupled pixel and the array of infrared antenna-coupled pixels for course spatial sampling of the millimeter pixel and fine spatial sampling of the infrared pixels. In an embodiment, the system further includes an output device for collecting the samples and converting the samples into electrical signals to be displayed on a display unit.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A dual-band focal plane array for detecting infrared and millimeter-wave radiation, comprising:
   at least one millimeter-wave pixel element having a millimeter-wave slot antenna; and
   an array of infrared pixel elements each having an infrared-wave slot antenna, wherein the plural infrared-wave slot antennas are incorporated into the construction of said millimeter-wave slot antenna to form a two-dimensional dual-band focal plane array for detecting infrared-wave and millimeter-wave radiation substantially simultaneously.

2. The dual-band focal plane array of claim 1, wherein said array of infrared pixel elements comprises:
   an 8-by-8 array of infrared-slot antennas incorporated into said at least one millimeter-wave pixel element.

3. The dual-band focal plane array of claim 1, wherein said array of infrared pixel elements comprises:
   a 32-by-32 array of infrared-slot antennas incorporated into said at least one millimeter-wave pixel element.

4. A dual-band single aperture system for operating in an infrared and a millimeter-wave frequency bands, comprising:
   a dual-band focal plane array having an array of millimeter pixel elements each having a millimeter-wave antenna and an array of infrared pixel elements each having an infrared slot antenna incorporated into each of said array of millimeter pixels for detection of an infrared and a millimeter-wave radiation;
   a sampling device coupled with said dual band focal plane array for sampling said array of millimeter pixel elements and said array of infrared pixel elements at intervals corresponding to said infrared and said millimeter-wave frequency bands; and
   an output device interfaced with said sampling device for collecting the samples and converting the samples into electrical signals to be displayed on a display unit.

5. The system of claim 4, wherein said array of millimeter-wave antenna-coupled pixels provide a coarse spatial sampling of said array of millimeter pixel elements and said array of infrared-wave antenna-coupled pixels incorporated to each pixel of said array of millimeter-wave antenna-coupled pixels provides a fine spatial sampling of said array of infrared pixel elements.

6. The system of claim 5, wherein said sampling device comprises:
   a first array of detectors for sampling said millimeter radiation at said array of millimeter-wave antenna-coupled pixels; and
   a second array of detectors for detecting said infrared radiation at said array of infrared antenna-coupled pixels.

7. The system of claim 6, wherein said first and said second array of detectors comprises:
   a diode detector array sensitive to both of said millimeter-wave frequency band and said infrared frequency band.

8. The system of claim 4, wherein said array of millimeter pixel elements is an 8-by-8 array having a 32-by-32 array of infrared pixel elements incorporated therein.

9. The system of claim 4, wherein said sampling device comprises:
   an array of sensors sensitive to both of said millimeter-wave frequency band and said infrared frequency band.

10. The system of claim 4, wherein said output device comprises:
    an array of multiplexers for receiving said samples; and
    a electronic unit for converting said samples into said electrical signals for display on said display unit.

11. A method for detecting dual bands in a single aperture system, the method comprising the step of:
    providing a dual-band focal plane array having a millimeter antenna-coupled pixel and an array of infrared slot antenna-coupled pixels incorporated into a ground plane of the millimeter-wave antenna;
    detecting millimeter-wave radiation at the millimeter antenna-coupled pixel; and
    detecting an infrared-wave radiation at the array of infrared slot antenna-coupled pixels incorporated into the millimeter antenna-coupled pixel.

12. The method of claim 11, further comprising:
sampling the millimeter antenna-coupled pixel and the array of infrared slot antenna-coupled pixels at intervals corresponding to the dual bands for coarse spatial sampling of the millimeter pixel element and fine spatial sampling of the infrared pixel elements.

13. The method of claim 12, further comprising:
collecting said coarse and said fine spatial samplings; and converting said collected samplings to electrical signals for display on a display device.

* * * * *